(12) United States Patent
Wang et al.

(10) Patent No.: US 6,617,884 B2
(45) Date of Patent: Sep. 9, 2003

(54) FAST LOCKING PHASE FREQUENCY DETECTOR

(75) Inventors: Xiaobao Wang, Santa Clara, CA (US); Chiakang Sung, Milpitas, CA (US); Joseph Huang, San Jose, CA (US); Bonnie I. Wang, Cupertino, CA (US); Khai Nguyen, San Jose, CA (US); Wayne Yeung, San Francisco, CA (US); In Whan Kim, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/160,355

(22) Filed: May 28, 2002

(65) Prior Publication Data

US 2002/0158671 A1 Oct. 31, 2002

Related U.S. Application Data

(62) Division of application No. 09/432,442, filed on Nov. 2, 1999.
(60) Provisional application No. 60/107,101, filed on Nov. 4, 1998.

(51) Int. Cl.[7] .............................................. H03D 13/00
(52) U.S. Cl. ................................. 327/12; 327/3; 327/7
(58) Field of Search ................................ 327/2, 3, 5, 7, 327/8, 9, 10, 12

(56) References Cited

U.S. PATENT DOCUMENTS

| 4,764,737 A | * | 8/1988 | Kaatz ........................... 331/1 A |
| 4,884,035 A | * | 11/1989 | Cok et al. .................... 328/133 |
| 4,902,920 A | * | 2/1990 | Wolaver ........................ 327/12 |
| 5,095,287 A | * | 3/1992 | Irwin et al. .................. 331/1 A |
| 5,298,866 A | | 3/1994 | Kaplinsky |
| 5,640,523 A | * | 6/1997 | Williams ..................... 375/360 |
| 5,642,082 A | | 6/1997 | Jefferson |
| 5,699,020 A | | 12/1997 | Jefferson |
| 5,734,301 A | | 3/1998 | Lee et al. |
| 5,744,991 A | | 4/1998 | Jefferson et al. |
| 5,774,023 A | | 6/1998 | Irwin |
| 5,781,048 A | | 7/1998 | Nakao et al. |
| 5,796,355 A | * | 8/1998 | Smigelski ..................... 311/33 |
| 5,870,003 A | | 2/1999 | Boerstler |
| 5,909,201 A | | 6/1999 | Hush et al. |
| 5,933,037 A | | 8/1999 | Momtaz |
| 5,936,430 A | * | 8/1999 | Patterson ..................... 327/12 |
| 5,963,069 A | | 10/1999 | Jefferson et al. |
| 6,104,251 A | | 8/2000 | Ramey et al. |

OTHER PUBLICATIONS

"ORCA® OR3Cxx (5 V) and OR3Txxx (3.3 V) Series Field–Programmable Gate Arrays", Lucent Technologies Microelectronics Groups, Preliminary Data Sheet, Nov. 1997.

WOLAVER, *Phase–Locked Loop Circuit Design*, PTR Prentice Hall, Englewood Cliffs, New Jersey, 1991, pp. 68–70.

* cited by examiner

Primary Examiner—Timothy P. Callahan
Assistant Examiner—An T. Luu
(74) Attorney, Agent, or Firm—Townsend and Townsend and Crew LLP

(57) ABSTRACT

A phase frequency detector (PFD) circuit (516) compares two clock signals and generates a number of outputs to indicate a phase difference between these two clock signals (513, 519). The phase frequency detector has more than three states. The PFD circuit may be used in phase locked loop (PLL) or delay locked loop (DLL) circuit in order to maintain or lock a phase relationship between the two clock signals. The PFD circuitry will allow for a fast lock acquisition time, even when there is a relatively wide frequency range between the two clock signals.

33 Claims, 11 Drawing Sheets

FAST LOCKING PHASE FREQUENCY DETECTOR

CROSS REFERENCE TO RELATED APPLICATION

This application is a division of application Ser. No. 09/432,442, filed Nov. 2, 1999, the disclosure of which is incorporated by reference.

This application claims the benefit of U.S. provisional application No. 60/107,101, filed Nov. 4, 1998, which is incorporated by reference along with all references cited in this application.

BACKGROUND OF THE INVENTION

The present invention relates to the field of electronic circuits, and in particular, a phase frequency detector circuit.

Many electronic systems use a master clock signal to synchronize the operation of all the circuitry and integrated circuit. A fundamental concept in electronic design, synchronous operation is important to ensure that logic operations are being performed correctly. In a system, an integrated circuit may generate its own internal clock based on the master clock signal. For example, this integrated circuit may be a microprocessor, ASIC, PLD, FPGA, or memory. The internal clock is synchronized with the master clock. And in order to ensure proper operation, it is often important to reduce skew for the internal clock of the integrated circuit.

The integrated circuit may use an on-chip clock synchronization circuit such as a phase locked loop (PLL) or delay locked loop (DLL). The synchronization circuit locks or maintains a specific phase relationship between the master clock and the internal clock. When the system is started, it is desirable that the internal clock be locked to the master clock as rapidly as possible. Under some circumstances, such as when there is a wide frequency difference between the two clock, the locking time may be slow. This is because the locking time may be dependent on the slower of the two frequencies. A slower locking time is undesirable because it will take longer for the system to initialize before normal operation. Also, as the master clock varies, it will take longer for the clock synchronization circuit to track these variations.

Therefore, techniques and circuitry are needed to address this problem of clock synchronization circuitry with slow lock acquisition times.

SUMMARY OF THE INVENTION

The invention is a phase frequency detector circuit to compare two clock signals and generate a number of outputs to indicate the phase difference between the two clock signals. This circuitry may be used in phase locked loop (PLL) or delay locked loop (DLL) circuit in order to maintain or lock a phase relationship between the two clock signals. In a PLL or DLL implementation, one of the clocks would be the reference clock or REFCLK, which the user supplies. The other clock is an internally generated clock or CLK that is fed back to the phase frequency detector circuit. In an embodiment, the phase frequency detector circuit has greater than three states. By having a greater numbers of states, the phase frequency detector will be able to generate a more rapidly. The DLL or PLL will have a faster lock acquisition time, even when there is a wide frequency range between the two clock signals.

In one embodiment, the invention includes a circuit having a first register with a first data input, a first clock input coupled to a first clock signal, and a first data output. The circuit includes a second register with a second data input coupled to the first data output, a second clock input coupled to the first clock signal, and a second data output. The circuit includes a third register having a third data input coupled, a third clock input coupled to a second clock signal, and a third data output. The circuit includes a fourth register having a fourth data input coupled to the third data output, a fourth clock input coupled to the second clock signal, and a fourth data output. The circuit includes a first logic gate, coupled to the first and third data outputs, having a first logic output coupled to a first clear input of the first register. The circuit includes a second logic gate, coupled to the second and third data outputs, having a second logic output coupled to a second clear input of the second register.

In another embodiment, the invention includes a phase logic loop circuit having an m-state phase frequency detector coupled to a reference clock signal and a feedback clock signal, where m is an integer greater than three. The circuit includes a charge pump coupled to the m-state phase frequency detector and a voltage controlled oscillator coupled to the charge pump. The voltage controlled oscillator generates a clock output. The circuit includes a divider circuit receiving the clock output and generating the feedback clock. The integer m is odd.

In a further embodiment, the invention includes a programmable logic integrated circuit having a plurality of logic array blocks, programmable configurable to perform logical functions and a programmable interconnect structure coupled to the logic array blocks. The programmable logic integrated circuit also includes a phase locked loop circuit, receiving a first reference clock signal and generating a clock output programmably coupled to the logic array blocks, where the phase locked loop circuit has a phase frequency detector circuit having m states, where m is greater than three.

The invention also includes a method of maintaining a phase relationship between a first clock signal and a second clock signal by providing a first output and a second output. A pulse is generated at the first output when a first edge of the first clock signal leads a second edge of the second clock signal. A pulse is generated at the second output when a third edge of the first clock signal leads the second edge. In one implementation, the first and second outputs are UP outputs. In another implementation, the first and second outputs are DOWN outputs.

Other objects, features, and advantages of the present invention will become apparent upon consideration of the following detailed description and the accompanying drawings, in which like reference designations represent like features throughout the figures.

DETAILED DESCRIPTION

Figure 1:
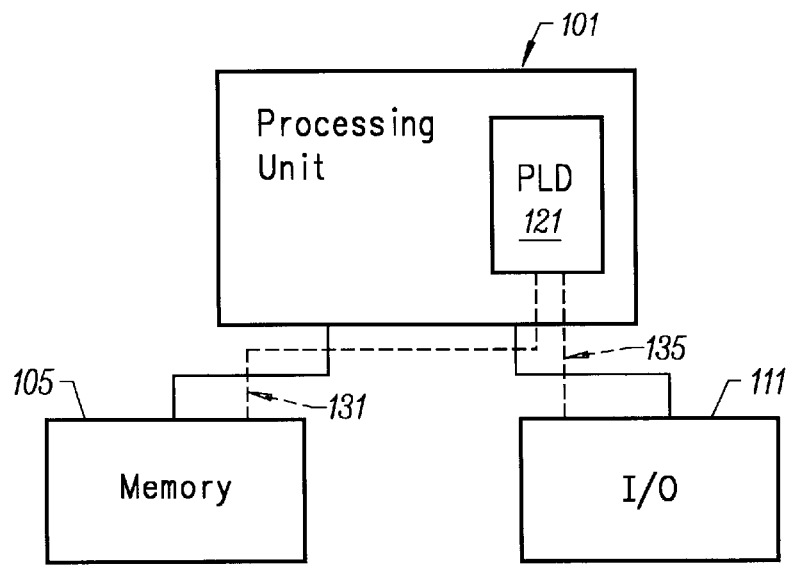
FIG. 1 is diagram of a digital system with a programmable logic integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258, 668, 5,260,610, 5,260,611, 5,436,575, and the Altera Data Book (1999), all incorporated by reference in their entirety for all purposes. Programmable logic integrated circuits and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
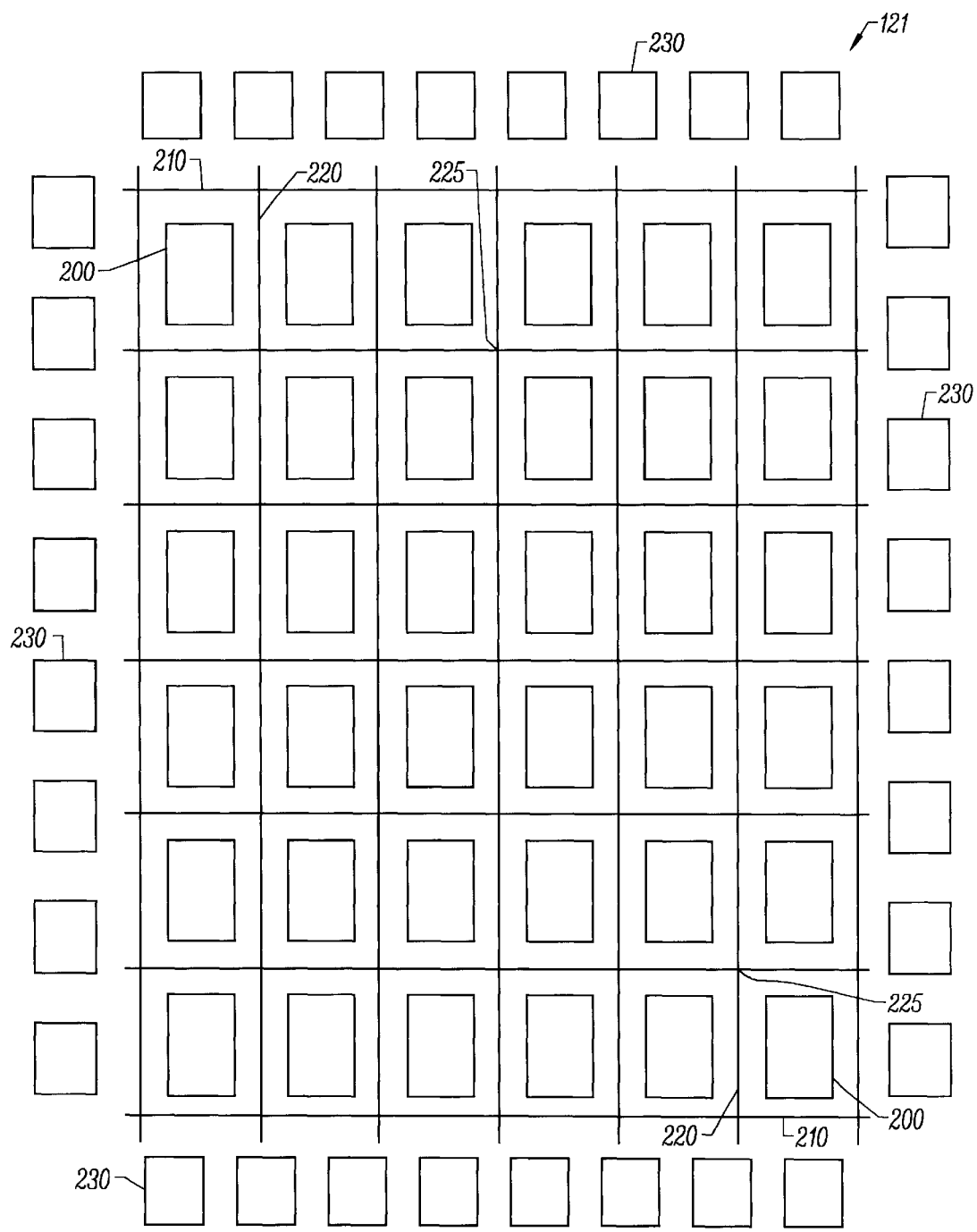
FIG. 2 is a diagram showing an architecture of a programmable logic integrated circuit.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

In other embodiments, the programmable logic integrated circuit may include special or segmented interconnect that is connected to a specific number of LABs and not necessarily an entire row or column of LABs. For example, the segmented interconnect may programmably connect two, three, four, five, or more LABs.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
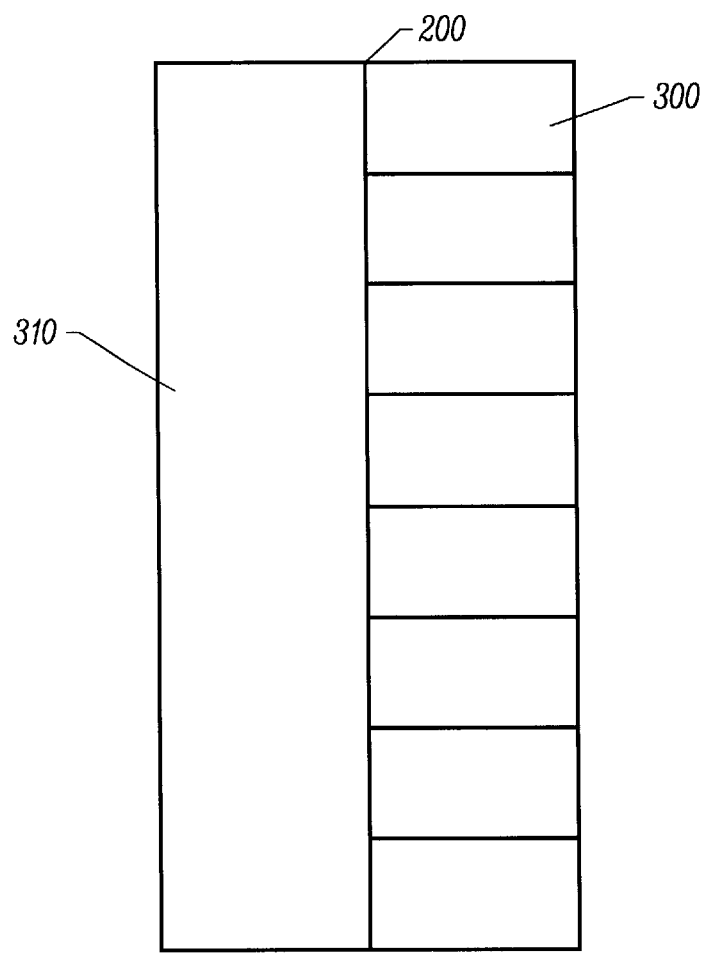
FIG. 3 is a simplified block diagram of a logic array block (LAB)

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structured 10, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4A:
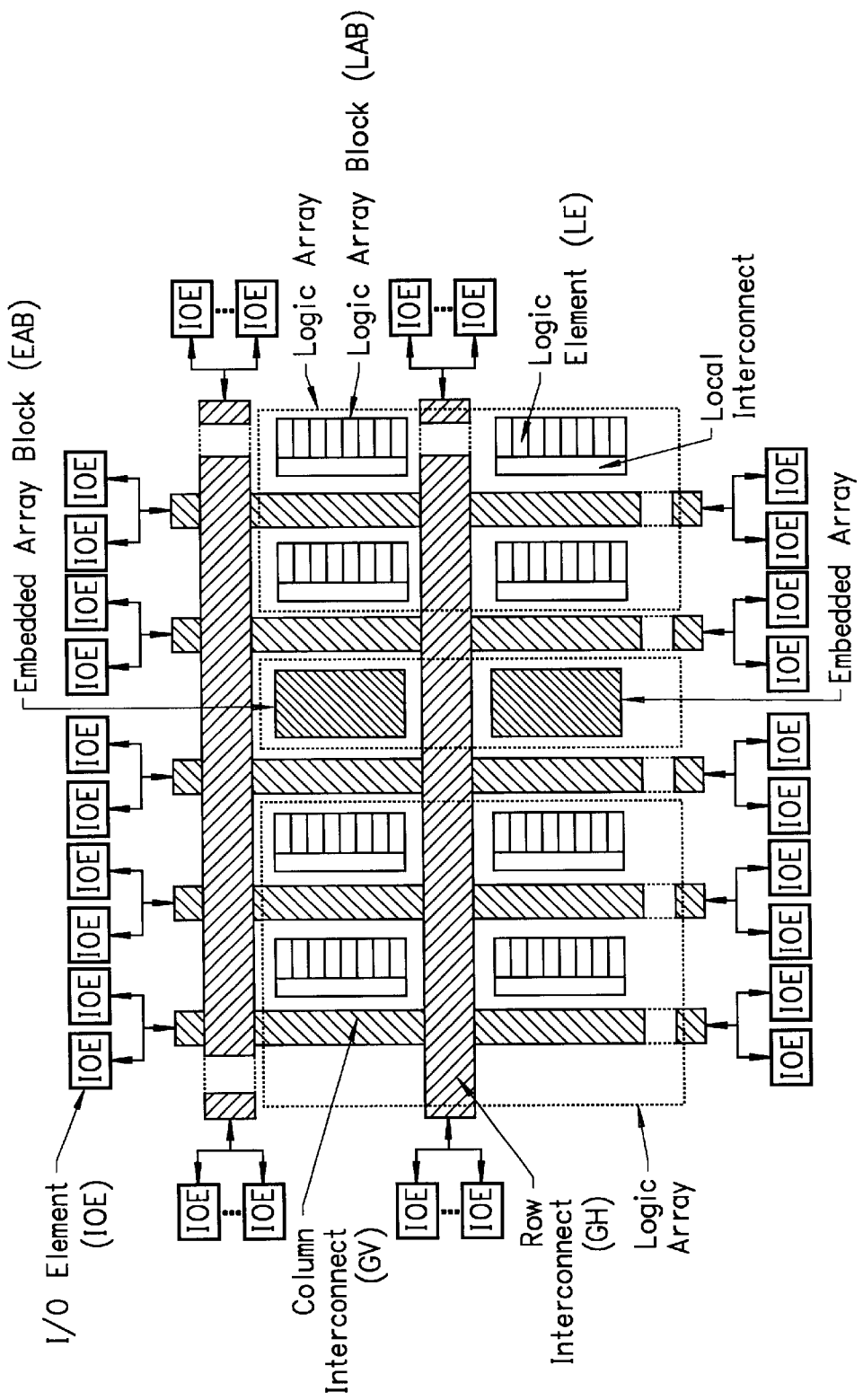
FIG. 4A shows an architecture of a programmable logic integrated circuit with embedded array blocks (EABs)

FIG. 4A shows a PLD architecture similar to that in FIG. 2. The architecture in FIG. 4A further includes embedded array blocks (EABs). EABs contain user memory, a flexible block of RAM. More discussion of this architecture may be found in the Altera Data Book (1999) in the description of the FLEX 10K product family and also in U.S. Pat. No. 5,550,782, which are incorporated by reference.

Figure 4B:
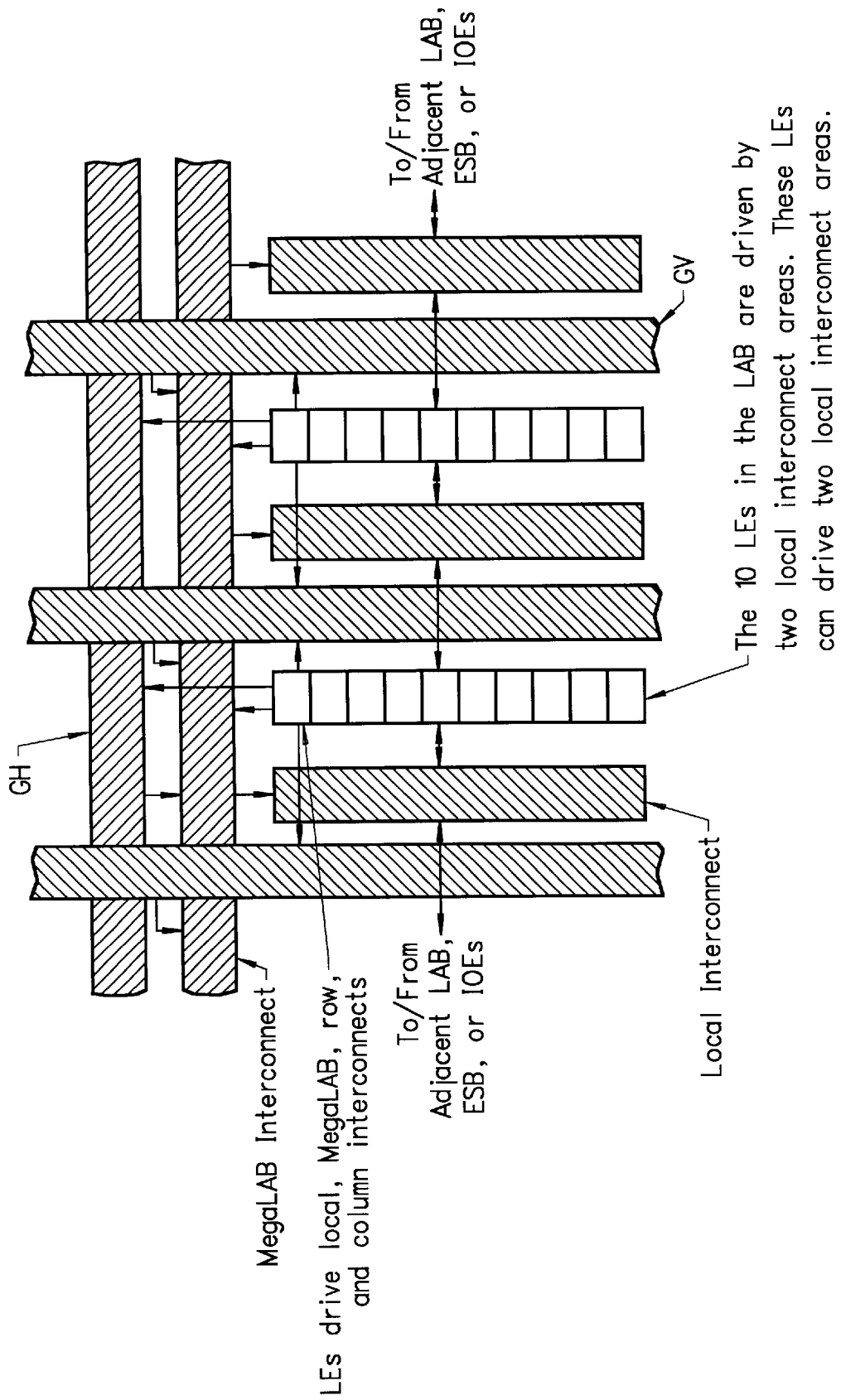
FIG. 4B shows an architecture of a programmable logic integrated circuit with megaLABs.

FIG. 4B shows a further embodiment of a programmable logic integrated circuit architecture. FIG. 4B only shows a portion of the architecture. The features shown in FIG. 4B are repeated horizontally and vertically as needed to create a PLD of any desired size. In this architecture, a number of LABs are grouped together into a megaLAB. In a specific embodiment, a megaLAB has sixteen LABs, each of which has ten LEs. There can be any number of megaLABs per PLD. A megaLAB is programmably connected using a megaLAB interconnect. This megaLAB interconnect may be considered another interconnect level that is between the global interconnect and local interconnect levels. The megaLAB interconnect can be programmably connected to GVs, GHs, and the local interconnect of each LAB of the megaLAB. Compared to the architecture of FIG. 2, this architecture has an additional level of interconnect, the megaLAB interconnect. Such an architecture is found in Altera's APEX™ family of products, which is described in detail in the APEX 20K Programmably Logic Device Family Data Sheet (August 1999), which is incorporated by reference. In a specific implementation, a megaLAB also includes an embedded system block (ESB) to implement a variety of memory functions such as CAM, RAM, dual-port RAM, ROM, and FIFO functions.

In an embodiment, the invention is a the PLD having a delay locked loop (DLL) or phase locked loop (PLL) circuit. DLL and PLL circuits are an important feature to minimize clock skew in such programmable integrated circuits as PLDs or FPGAs. A description of on-chip DLL and PLL circuitry for a PLD is discussed in U.S. Pat. No. 5,744,991, which is incorporated by reference. U.S. patent application Ser. No. 09/285,180, filed Mar. 23, 1999, discusses aspects of a programmable wide frequency synthesizer and is also incorporated by reference. The DLL or PLL circuitry of the PLD would include a m-state phase frequency detector circuit of the invention. In a specific case, m is an odd integer greater than three. For example, the phase detector of the invention may have five, seven, nine, eleven, thirteen, or more states. The invention is especially well suited for programmable logic integrated circuits because there may be a relatively large difference in frequencies between the reference clock and internally generated clock. A typical clock frequency range for a PLD is from about 1 megahertz to about 460 megahertz, or more. By using the m-state phase frequency detector of the invention, the circuitry will lock the phase more rapidly. The circuitry of the invention is also useful for other types of integrated circuit including microprocessors, microcontrollers, memories, DRAMs, and SRAMs.

Figure 5:
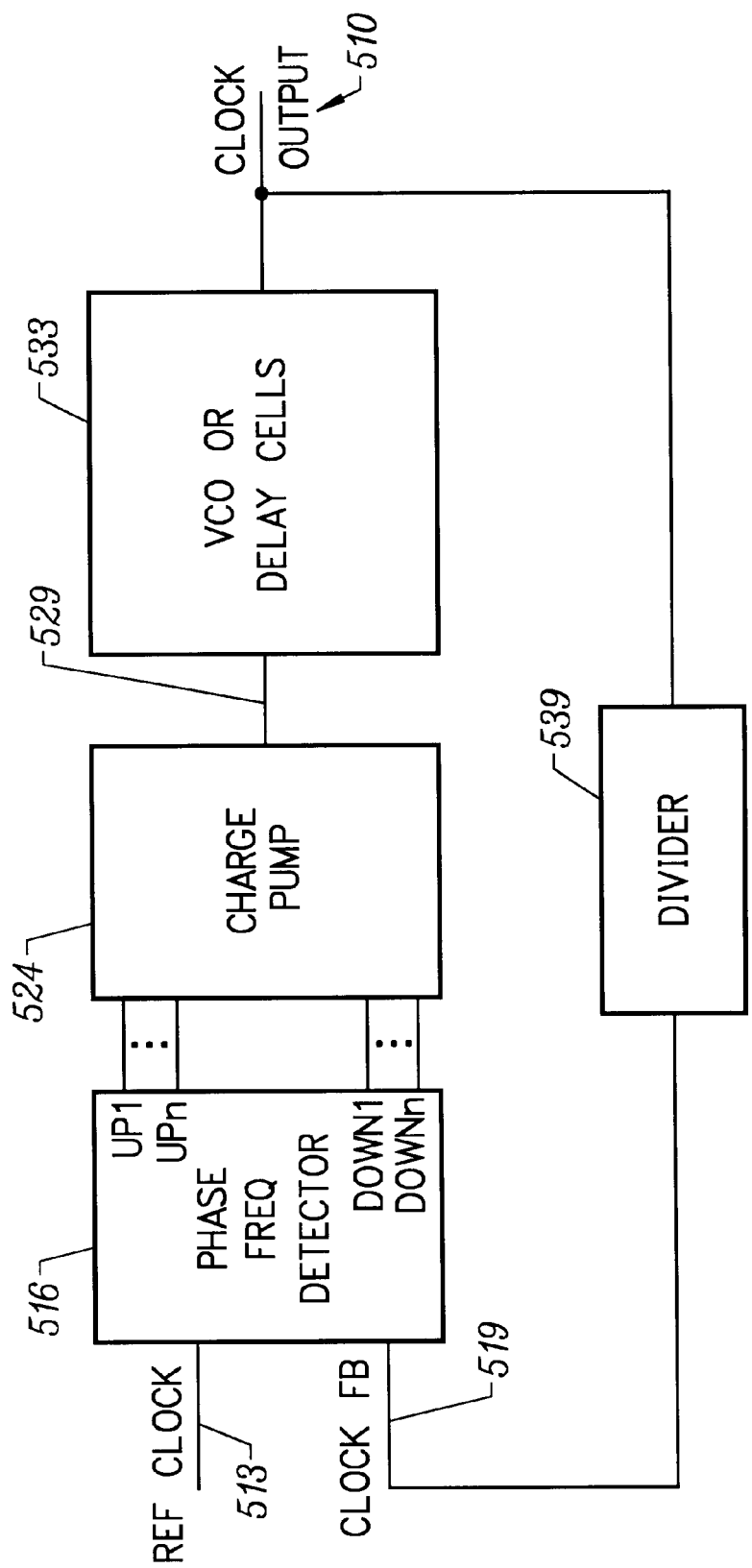
FIG. 5 shows a phase locked loop circuit.

FIG. 5 shows a phase locked loop circuit of the invention. A phase locked loop circuit is sometimes referred to as a PL or PLL. The PL is generally on an integrated circuit and takes as input a reference clock 513, usually from an external source. The phase locked loop circuit generates a clock output 510 that is maintained or locked in a particular phase relationship with reference clock 513. In a typical case, the clock output will be in phase with an edge of the reference clock. The clock output can also be placed in any phase relationship—such as 20 degrees out-of-phase, 60 degrees output-of-phase, 90 degrees output-of-phase, −45 degrees output-of-phase, and so forth—with respect to the reference clock. The phase relationship between the reference clock and clock output may be selected by the design or can be user specified.

In a programmable logic integrated circuit, the clock output would be programmably connectable to the logic array blocks, embedded array blocks, configurable logic blocks, and other logical elements. The PL will distribute clock signals with no or reduced skew. This is especially important for larger integrated circuits because there are more logical elements and the interconnections are usually longer. The programmable logic integrated circuit may have more than one PL circuit to support multiple clock signals. In a specific embodiment, a programmable logic integrated circuit having an architecture such as shown in FIG. 4A has six independent PL circuits. Four of these PL circuits can be TTL PLs, where the reference clock signal is provided using TTL input levels. The other two PLs are low voltage differential signal (LVDS) PLs, where the reference clock is provided using LVDS input levels.

In FIG. 5, the PL includes a phase frequency detector (PFD) 516, which receives and compares the reference clock and a clock feedback 519. Based on this comparison, the phase frequency detector outputs UP1 to UPn signals and DOWN1 to DOWNn signals to a charge pump circuit 524. For example, when the reference clock leads the feedback clock, an UP pulse is generated. When the feedback clock leads the reference clock, a DOWN pulse is generated. Based on the UP and DOWN signals, the charge pump circuit outputs a control signal 529 to adjust some delay cells 533 to maintain or lock a phase relationship between the clock output and the reference clock. The delay cells may be implemented using a number of buffers or inverters connected in a ring oscillator arrangement. The delay cells may be referred to as a variable controlled oscillator or VCO. By adjusting the control signal, the frequency of the VCO clock output 510 is adjusted. By changing the frequency, this also adjusts the phase. The clock output is fed back through a divider circuit 539, which generates clock feedback 519, to the phase frequency detector. In an embodiment, the divider circuit divides the frequency of the clock output by an amount from 1 to about 256.

The phase frequency detector is an m-state phase detector, where there will be (m−1)/2 UP and (m−1)/2 DOWN signals. For example, a three-state phase detector will have an UP and DOWN signal. A five-state phase detector will have UP1, UP2, DOWN1, and DOWN2 signals. A seven-state phase detector will have three UP and three DOWN signals. The UP signal is a pulse to adjust the charge pump in a first direction, and the DOWN signal is a pulse to adjust the charge pump in a second direction. The first direction is usually the opposite of the second direction. For example, the UP pulse may adjust the phase of the VCO output clock in a positive direction in relation to the reference clock edge, and the DOWN will adjust the VCC output clock in a negative direction. By providing a series of UP and DOWN signals, the phase relationship between the clock and reference clock is maintained.

An m-state phase frequency detector of the invention may also be used in a DLL circuit. The phase frequency detector could be incorporated into a DLL circuit in a similar fashion as it is incorporated into a PLL circuit. The techniques and circuitry of the invention can be applied to phase detector circuits and frequency detector circuits.

The PL circuitry of the invention will lock more quickly because the phase frequency detector reacts more quickly to phase differences by generating UP and DOWN signals more frequently. A three-state phase detector circuit is slower than similar circuitry having five or more states because the circuitry must reset to the initial state before there can be a pulse. A five-state phase frequency detector will lock at least as quickly as a three-state phase frequency detector. In the typical case, a five-state phase detector will lock or align the phase of the clock about twice as fast as a three-state phase detector. For a clock frequency range from 1 megahertz to 460 megahertz, the five-state phase frequency detector will lock the phase up to twice as fast as a three-state phase detector. A five-state phase frequency detector generates two pulses for every one pulse of a three-state phase frequency detector. It will generally take longer for the PL circuitry to lock at lower frequencies because the circuitry is operating more slowly. At lower frequencies, a five-state phase detector will be faster than a three-state phase detector.

Figure 6:
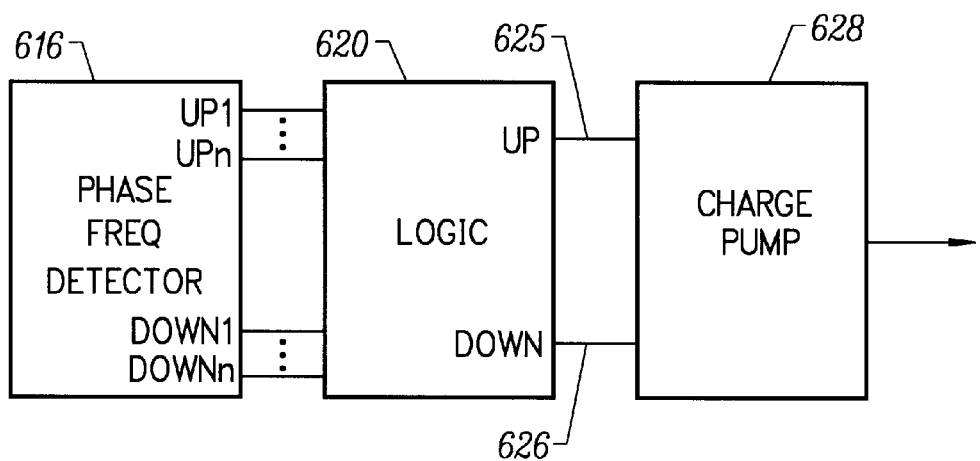
FIG. 6 shows a portion of another implementation of a the phase locked loop circuit.

For an m-state phase detector, where m is greater than three, the UP1 to UPn signals can be combined and treated as a single UP signal by the charge pump. And, the DOWN1 to DOWNn signals are combined and treated as a single DOWN signal by the charge pump. As shown in FIG. 6, there is logic 620 to combine the UPn and DOWNn signals into a single UP signal 625 and DOWN signal 626. The UP and DOWN signals will be input to the charge pump 628. By using logic 620, similar charge pump circuitry as used for a three-state phase detector can be used for the m-state phase detector. The logic may be separate from the phase frequency detector circuitry, part of the phase frequency detector circuitry, or part of the charge pump circuitry.

Figure 7:
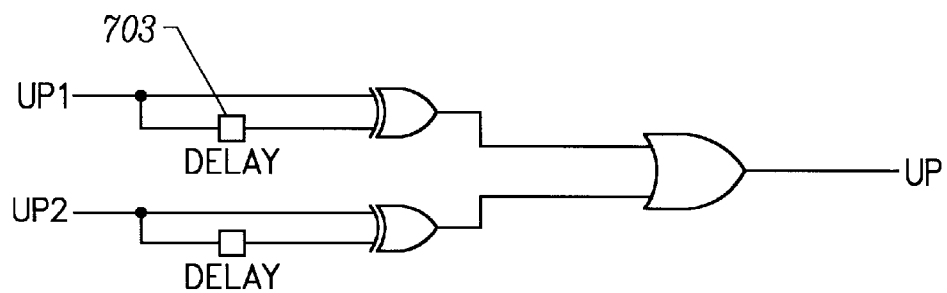
FIG. 7 shows circuitry to generate a single UP signal from UP1 and UP2 signals.

FIG. 7 shows circuitry than can be used to implement logic 620 for the UP signals. Similar circuitry can be used for the DOWN signals. UP1 and a delayed version of the UP1 (as a result of delay block 703) are input into an exclusive OR gate. Delay block 703 provides a delay from its input to its output. Delay block 703 may be implemented using a chain of inverters. There are many other techniques to implement a delay block in an integrated circuit, and any of these techniques may be used. The output of the XOR gate is input to an OR gate. There are similar XOR gate circuits for each of the n UP signals. The output of the OR gate is UP, which will pulse every time there is a pulse on any of the UP1 to UPn inputs. Delay 703 makes the pulse from the XOR gate have a constant width, which will be based on the length of the delay provided by delay block 703. To make the pulse widths from all the XOR gates the same, the length of delay 703 for each of the UP branches should be the same.

The figure shows only one implementation of the logic. As one of skill in logic design understands, there are many other ways to implement the same logical function using different types of gates and circuitry. For example, the circuity may use pass gates, transmission gates, NAND gates, NOR gates, inverters, AND gates, and other gates in substitution for the XOR and OR gates shown.

Figure 8:
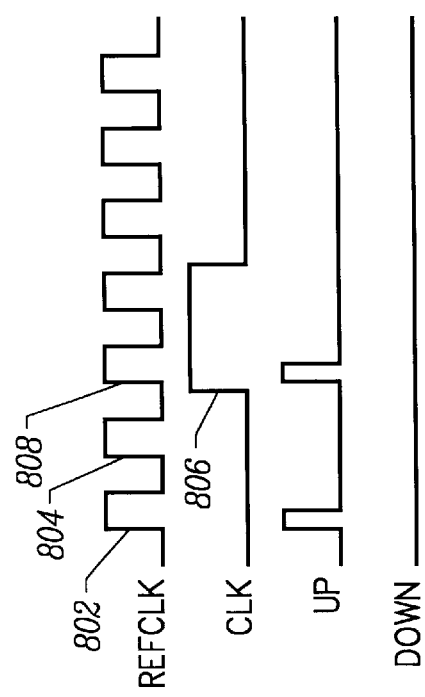
FIG. 8 shows a timing diagram for a three-state phase frequency detector.
Figure 9:
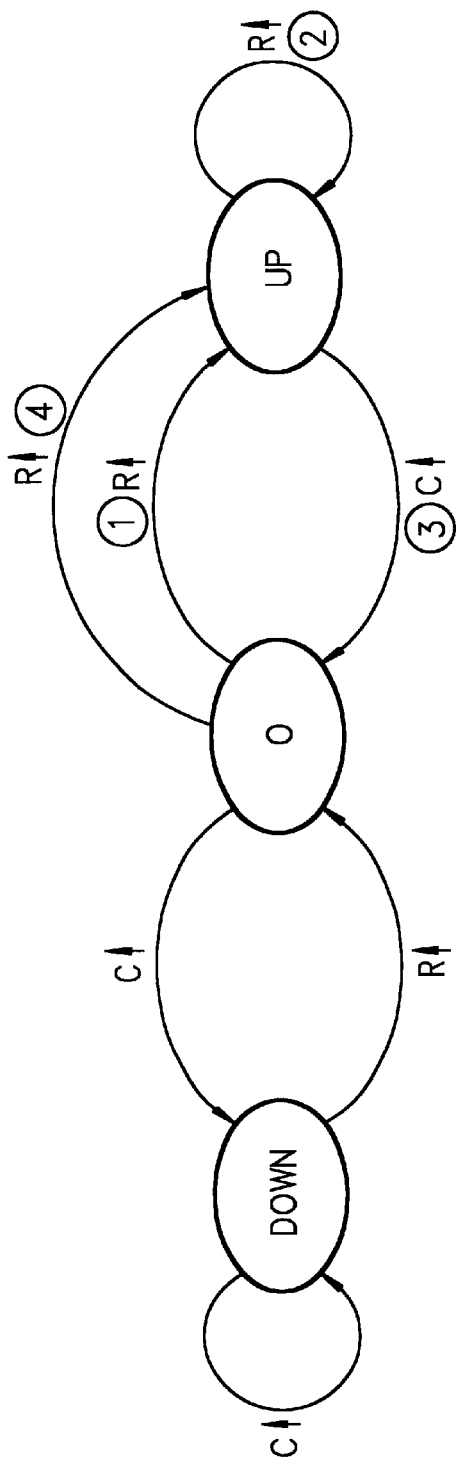
FIG. 9 shows a state diagram for a three-state phase frequency detector.

FIG. 8 shows timing diagrams for an example of the operation of a three-state phase frequency detector. FIG. 9 shows a state diagram for a three-state phase frequency detector. When entering an UP or DOWN state, the circuitry will generate an UP or DOWN pulse, respectively. When exiting or remaining in the UP or DOWN state, no pulse is generated.

For FIG. 8, assuming the circuitry starts in the 0 state, since the reference clock leads the clock at time 802, the circuitry goes to the UP state and generates a pulse. This is represented by the arrow labeled with a circled 1 in FIG. 9. At time 804, the reference clock leads the clock. The circuitry will remain in the UP state; no pulse is generated. This is represented by the arrow labeled with a circled 2 in FIG. 9. At time 806, the clock leads the reference clock, so the circuitry resets or exits the UP state to return to the 0 state. No pulse is generated. This is represented by the arrow labeled with a circled 3 in FIG. 9. At time 808, the reference clock leads the clock, and the circuitry goes to the UP state. A pulse is generated. This is represented by the arrow labeled with a circled 4 in FIG. 9.

Figure 10:
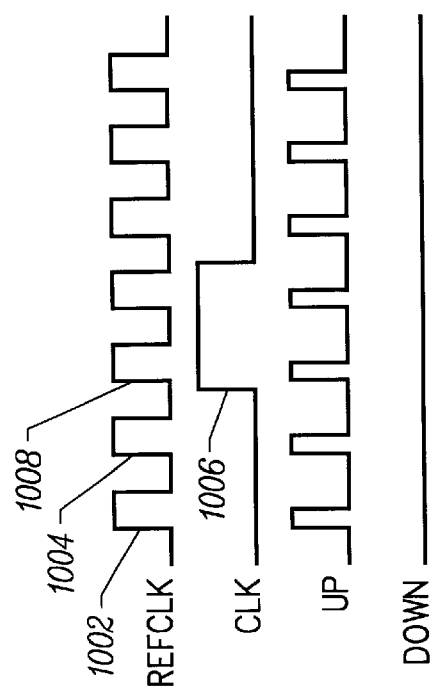
FIG. 10 shows a timing diagram for an m-state phase frequency detector.
Figure 11:
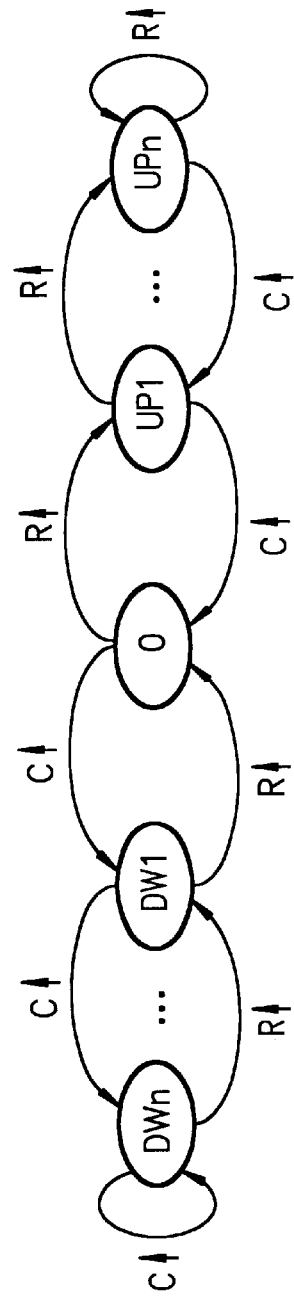
FIG. 11 shows a state diagram for an m-state phase frequency detector.

FIG. 10 shows a timing diagram for the same reference clock and clock inputs as FIG. 8, but the phase frequency detector has m states. FIG. 11 shows a state diagram for an m-state phase frequency detector. Although shown as operating based on rising clock edges, the circuitry could also be easily modified to operate based on falling clock edges. The phase detector is initially at state 0. It goes to state UP1 if the reference clock or REFCLK rising edge comes first. It returns to state 0 when the next rising edge is the VCO clock or CLK. If the next rising edge is CLK again, it goes to DW1 or DOWN1. Operation continues in this fashion moving from state to state as indicated in FIG. 11. For an m-state phase frequency detector, m is equal to 2*n+1.

The m-state phase frequency detector generates UP or DOWN pulses based on both the phase error and frequency difference of the two input clocks, REFCLK and CLK. If the frequency of REFCLK is several times faster than CLK, multiple UP pulses will be generated. If the frequency of the CLK is several times faster than the REFCLK, then multiple DOWN pulses will be generated. When it is in state 0, it generates no pulses. When in state UP1, it generates one up pulse. In state UPn, it generates m UP pulses, if the state machine stays at UPn, then no extra UP pulse is generated regardless of extra REFCLK rising edges. In state DOWN1, it generates one DOWN pulse. In state DOWNn, it generates n DOWN pulses. Similarly, if the state machine stays at DOWNn, then no extra down pulse is generated regardless of extra CLK rising edges.

For FIG. 10, the phase frequency detector receives and detects a string of rising edges of the reference clock before it sees a rising edge of the clock. A maximum of (m−1)/2 up pulses are generated, where m is the number of states. Assuming the circuitry starts in the 0 state, since the reference clock leads the clock at time 1002, the circuitry goes to the UP1 state and generates an UP pulse. At time 1004, the reference clock leads the clock. The circuitry will go to the UP2 state and generates another UP pulse. At time 1006, the clock leads the reference clock, so the circuitry resets or exits the UP2 state to return to the UP1 state. No pulse is generated. This is represented by the arrow labeled with a circled 3 in FIG. 11. At time 1008, the reference clock leads the clock, and the circuitry goes to the UP2 state. An UP pulse is generated. UP pulses continue to be generated as shown in FIG. 10 according to the state diagram of FIG. 11.

The three-state phase detector generates UP and DOWN pulses based on the phase delay between the two input clocks, reference clock and VCO clock (i.e., clock signal generated by the VCO). When the two clock frequencies are sufficiently or significantly different, the frequencies of the UP and DOWN pulses the phase detector generates will be determined by the slower of the two clock frequencies. This means the frequency of the UP and DOWN pulses will be at about the same frequency as the slower clock. In FIG. 8, the UP pulses were generated at about the frequency of the VCO clock signal. Compared to the m-state phase frequency detector of FIG. 10, a disadvantage of this phase detector implementation is that it has slow lock time when the VCO has wide frequency range, especially with low reference clock frequencies. Slow lock time refers to the time it takes for the circuitry receiving the up and down signals to "lock" on to the appropriate valve.

Therefore, the m-state phase and frequency detector of the invention can overcome the disadvantage of a three-state phase detector by generating UP and DOWN pulses that are determined by the faster clock input to the phase detector. The resulting phase and frequency detector will have more sensitivity to the frequency difference between the reference clock and VCO clock. Hence, it will have a faster lock time when the reference clock and VCO clock natural frequencies are sufficiently or significantly different. In FIG. 10, note the higher frequency at which UP pulses are generated as compared to that in FIG. 8.

Figure 12:
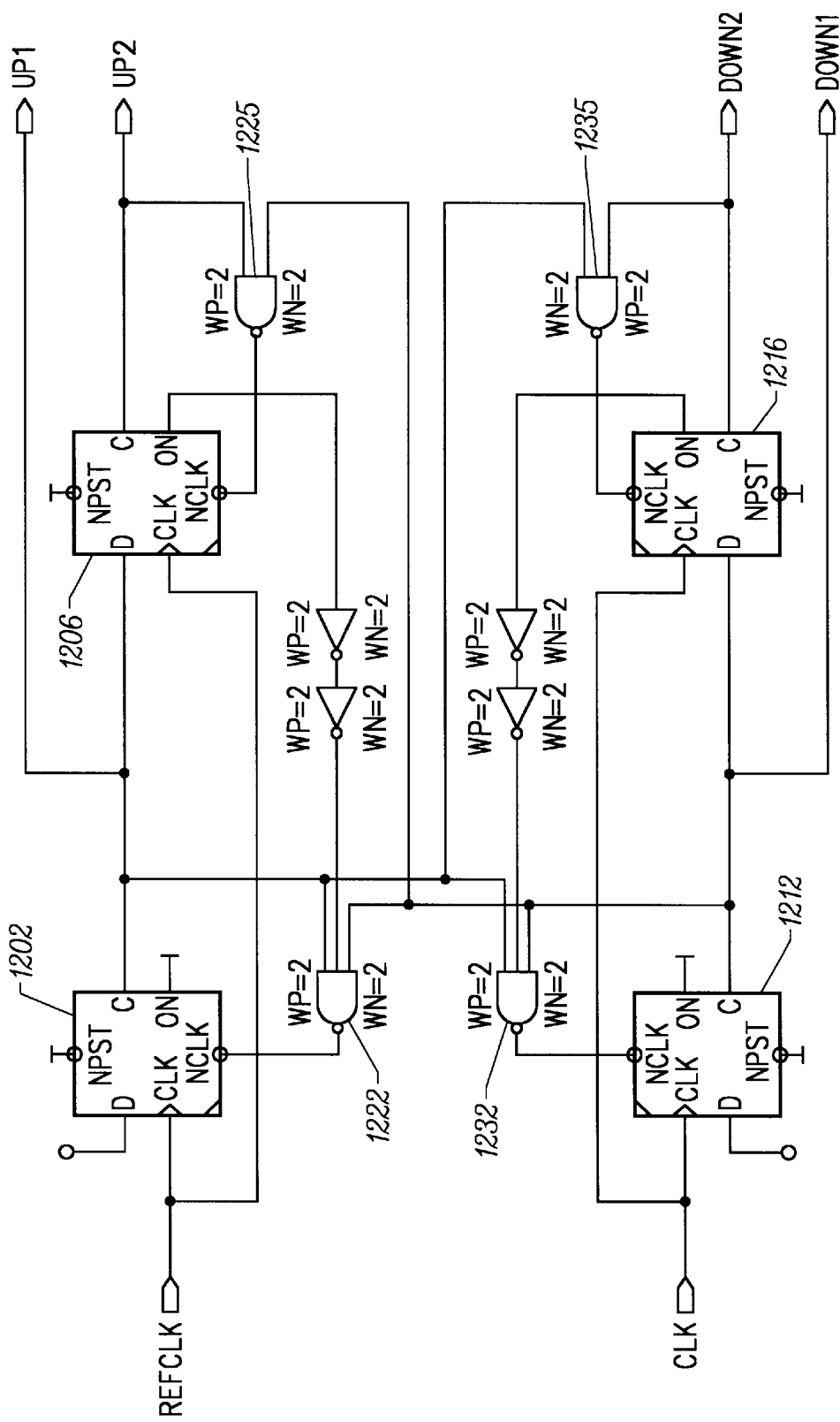
FIG. 12 shows a circuit diagram for a five-state phase frequency detector.
Figure 13:
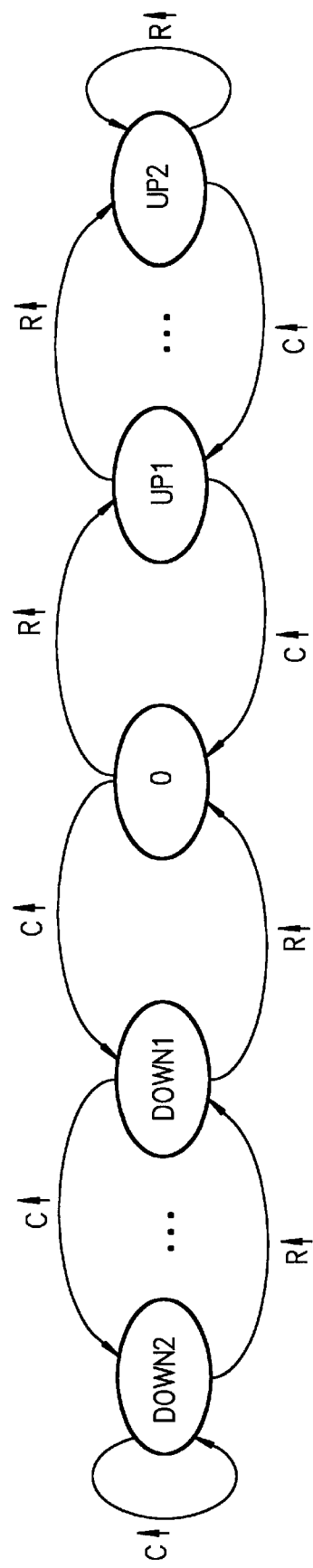
FIG. 13 shows a state diagram for a five-state phase frequency detector.

FIG. 12 shows a circuit implementation of a five-state phase frequency detector. FIG. 13 shows a state diagram for the operation of this detector circuit. The phase detector circuit of the invention may however have more than five states; for example, the circuitry may have seven, nine, eleven, thirteen, or more states. Similar circuitry and techniques may be used to implement a detector for m-states. There are two inputs, REFCLK and CLK. There are four outputs, UP1, UP2, DOWN1, and DOWN2. When the REFCLK rising edge occurs, UP1 goes high. UP2 goes high if the next clock rising edge is still REFCLK. UP2 will go low when the CLK rising edge comes, and so on. The pulse width of UP1, UP2, DOWN1, and DOWN2 can be limited to certain maximum widths using for example the XOR and delay block circuitry of FIG. 7.

REFCLK is connected to a clock input of a D-register 1202 and a D-register 1206. A D input of register 1202 is connected to VCC or VDD, which is a logic 1 input. A Q output of register 1202 outputs UP1. The Q output of register 1202 is connected to a D input of register 1206. A Q output of register 1206 outputs UP2.

CLK is connected to a clock input of a D-register 1212 and a D-register 1216. A D input of register 1212 is connected to VCC or VDD, which is a logic 1 input. A Q output of register 1212 outputs DOWN1. The Q output of register 1212 is connected to a D input of register 1216. A Q output of register 1216 outputs DOWN1.

Although the circuitry in this figure used D-type registers, other types of storage circuits and blocks may also be used. For example, instead of D-type registers, the circuitry may be implemented using latches and flip-flops including J-K, S-R, T, and other types of flip-flops. The D-registers in the circuit have an NPST input, an active low preset input. The NPST function is not used. Therefore, NPST inputs are connected to VCC or VDD to disable the function. Registers without an NPST input may also be used.

An output of NAND gate 1222 is connected to an NCLR input, an active low clear input, of register 1202. Inputs to NAND gate 1222 are UP1, a QN output (inverted Q, Q bar output, or /UP2) of register 1206, and DOWN1. The QN output from register 1206 is buffered and delayed using two inverters. The two inverters are used so that at the time register 1206 is reset, register 1202 is not reset. It is desirable that the registers are reset one at a time, so that registers 1206 and 1202 are not reset at the same time. This will enable proper operation of the state machine. An output of NAND gate 1225 is connected to an NCLR input of register 1206. Inputs to NAND gate 1225 are connected to UP2 and DOWN1. An output of NAND gate 1232 is connected to an NCLR input of register 1212. Inputs to NAND gate 1232 are UP1, a QN output (inverted Q, Q bar, or /DOWN2) of register 1216, and DOWN1. The QN output from register 1216 is buffered and delayed using two inverters. The two inverters are used so that at the time register 1216 is reset, register 1212 is not reset. It is desirable that the registers are reset one at a time, so that registers 1216 and 1212 are not reset at the same time. This will enable proper operation of the state machine. An output of NAND gate 1235 is connected to an NCLR input of register 1216. Inputs to NAND gate 1235 are connected to UP1 and DOWN2.

In this implementation, the logic gates are NAND gates. Other types of logic gates and logic elements may be used in other implementations of the invention. For example, NOR, AND, OR, pass gates, look-up tables, and other logical structures may also be used. A three-input NAND gate may be implemented using two two-input NAND gates.

The operation of the circuitry is shown by the state diagram of FIG. 13. Starting the initial or 0 state, the UP1, UP2, DOWN1, and DOWN2 outputs of FIG. 12 are 0. Upon a REFCLK edge, the circuit will enter the UP1 state, and the UP1 output becomes 1. While in the UP1 state, upon another REFCLK edge, the circuit will enter the UP2 state, and the UP2 output becomes 1 while the UP1 output becomes 0. While in the UP1 state, upon a CLK edge, the circuit will return to the 0 state. The UP1 and UP2 outputs will be reset to 0. When in the UP2 state, upon a CLK edge, the circuit will return to the UP1 state. The UP1 and UP2 outputs will be 0. When in the UP2 state, upon a REFCLK edge, the circuit will remain in the UP2 state. The UP1 and UP2 outputs will be 0.

When in the 0 state, upon a CLK edge, the circuit will go to DOWN1 state, and the DOWN1 output will be 1. When in the DOWN1 state, upon another CLK edge, the circuit will enter the DOWN2 state, and the DOWN2 output becomes 1 while the DOWN1 output becomes 0. While in the DOWN1 state, upon a REFCLK edge, the circuit will return to the 0 state. The DOWN1 and DOWN2 outputs will be reset to 0. When in the DOWN2 state, upon a REFCLK edge, the circuit will return to the DOWN1 state. The DOWN1 and DOWN2 outputs will be 0. When in the DOWN2 state, upon a CLK edge, the circuit will remain in the DOWN2 state. The DOWN1 and DOWN2 outputs will be 0.

The UP1 and UP2 outputs will typically be connected to an OR gate that outputs a unified or combined UP signal, which will pulse when either UP1 or UP2 pulses. Similarly, DOWN1 and DOWN2 outputs will typically be connected to an OR gate that outputs a unified or combined DOWN signal, which will pulse when either DOWN1 or DOWN2 pulses. Also, these outputs may be made to have a maximum or specific pulse width by using circuitry similar to what is shown in FIG. 7.

Figure 14:
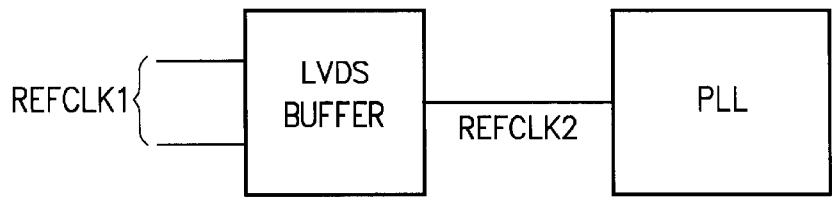
FIG. 14 shows a LVDS buffer and phase locked loop circuit.

FIG. 14 shows an embodiment of the invention where an LVDS buffer is coupled between a REFCLK1, provided using LVDS levels, and the PL circuitry. The LVDS buffer converts the REFCLK1 to REFCLK2 which is a reference clock signal that is CMOS compatible. The LVDS buffer may include comparator circuitry to detect and compare its inputs.

LVDS is an emerging standard, and there is currently no single standard. In one implementation of LVDS, there are two input lines. A voltage difference between the two lines is about 200 millivolts, and a center voltage for the lines is about 1.2 volts. One logical state is represented by having 1.1 volts on the first line and 1.3 volts on the second line. The other logical state is represented by having 1.3 volts on the first line and 1.1 volts on the second line. Since LVDS has as a relatively small voltage swing, very high speed switching is permitted with less EMI noise.

The PL circuit uses a CMOS-compatible clock input. So, the LVDS buffer converts the LVDS signal to CMOS compatible range. REFCLK2 will be in the range of 0 to VDD or VCC, which is typical of CMOS signals.

Figure 15:
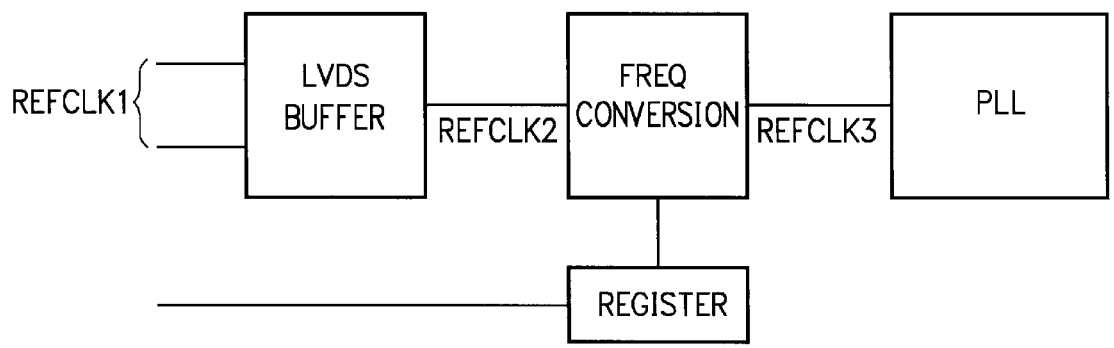
FIG. 15 shows a LVDS buffer, frequency conversion circuit, and phase locked loop circuit.

FIG. 15 shows the addition of a frequency conversion circuit to modify the frequency of the REFCLK1. Sometimes the LVDS clock signal is at a very high frequency that the PL circuitry cannot handle directly. The frequency conversion circuit generates REFCLK3, which is at a reduced frequency. The amount to divide down the clock frequency can be selected by a value stored in a register. This value can be selected and input by the user in parallel or serial to the register.

This detailed description of the invention has been presented for the purpose of illustration and description. It is not intended to be exhaustive or to limit the invention to the precise form described. Many modifications and variations are possible in light of this detailed description. The embodiments were chosen and described in order to best explain the principles of the invention and its practical applications. Others skilled in the art will recognize that various modifications can be made in order to best utilize and practice the invention for a particular application. The scope of the invention is defined by the following claims.

What is claimed is:

1. A circuit comprising:
 a first register having a first data input, a first clock input coupled to a first clock signal, and a first data output;
 a second register having a second data input coupled to the first data output, a second clock input coupled to the first clock signal, and a second data output;
 a third register having a third data input, a third clock input coupled to a second clock signal, and a third data output;
 a fourth register having a fourth data input coupled to the third data output, a fourth clock input coupled to the second clock signal, and a fourth data output;
 a first logic gate, coupled to the first and third data outputs, having a first logic output coupled to a first clear input of the first register; and
 a second logic gate, coupled to the second and third data outputs, having a second logic output coupled to a second clear input of the second register.

2. The circuit of claim 1 further comprising:
 a third logic gate, coupled to the first and third data outputs, having a third logic output coupled to a third clear input of the third register; and
 a fourth logic gate, coupled to the first and fourth data outputs, having a fourth logic output coupled to a fourth clear input of the fourth register.

3. The circuit of claim 1 wherein the first and second logic gates are NAND gates.

4. The circuit of claim 1 wherein the first register is a D-register and the first data input coupled to VCC.

5. The circuit of claim 1 wherein the second register has a first inverted data output coupled to the first logic gate.

6. The circuit of claim 2 wherein the fourth register has a second inverted data output coupled to the third logic gate.

7. The circuit of claim 1 further comprising:
 a third logic gate having a first input coupled to the first data output;
 a first delay circuit coupled between the first data output and a second input of the third logic gate;
 a fourth logic gate having a first input coupled to the second data output;
 a second delay circuit coupled between the second data output and a second input of the fourth logic gate; and
 a fifth logic gate coupled to outputs of the third and fourth logic gates.

8. The circuit of claim 7 wherein the third and fourth logic gates are exclusive OR gates.

9. The circuit of claim 7 wherein the fifth logic gate is an OR gate.

10. The circuit of claim 1 further comprising:
 a third logic gate having a first input coupled to the fourth data output;
 a first delay circuit coupled between the fourth data output and a second input of the third logic gate;
 a fourth logic gate having a first input coupled to the fourth data output;
 a second delay circuit coupled between the fourth data output and a second input of the fourth logic gate; and
 a fifth logic gate coupled to outputs of the third and fourth logic gates.

11. The circuit of claim 1 further comprising:
 a programmable logic integrated circuit.

12. A method of maintaining a phase relationship between a first clock signal and a second clock signal comprising:
 providing a first UP output and a second UP output;
 generating a pulse at the first UP output when a first edge of the first clock signal leads a first edge of the second clock signal; and
 generating a pulse at the second UP output when a second edge of the first clock signal leads the first edge of the second clock signal, wherein one pulse is generated at either the first UP output or the second UP output at a time.

13. The method of claim 12 further comprising:
providing a pulse at a third UP output when a pulse occurs at the first UP output or the second UP output.

14. The method of claim 12 further comprising:
using pulses at the first and second UP outputs to adjust the second clock signal.

15. A method of maintaining a phase relationship between a first clock signal and a second clock signal comprising:
providing a first UP output and a second UP output;
generating a pulse at the first UP output when a first edge of the first clock signal leads a first edge of the second clock signal;
generating a pulse at the second UP output when a second edge of the first clock signal leads the first edge of the second clock signal; and
making pulses generated at the first UP output and the second UP output having the same pulse width.

16. The method of claim 15 comprising: providing a pulse at a third UP output when a pulse occurs at the first UP output or the second UP output.

17. The method of claim 15 further comprising: using pulses at the first and second UP outputs to adjust the second clock signal.

18. The method of claim 15 wherein one pulse is generated at either the first UP output or the second UP output at a time.

19. A method of maintaining a phase relationship between a first clock signal and a second clock signal comprising:
providing a first DOWN output and a second DOWN output;
generating a pulse at the first DOWN output when a first edge of the first clock signal leads a first edge of the second clock signal; and
generating a pulse at the second DOWN output when a second edge of the first clock signal leads the first edge of the second clock signal,
wherein one pulse is generated at either the first DOWN output or the second DOWN output at a time.

20. The method of claim 19 further comprising:
providing a pulse at a third DOWN output when a pulse occurs at the first DOWN output or the second DOWN output.

21. The method of claim 19 further comprising:
using pulses at the first and second DOWN outputs to adjust the second clock signal.

22. A method of maintaining a phase relationship between a first clock signal and a second clock signal comprising:
providing a first DOWN output and a second DOWN output;
generating a pulse at the first DOWN output when a first edge of the first clock signal leads a first edge of the second clock signal;
generating a pulse at the second DOWN output when a second edge of the first clock signal leads the first edge of the second clock signal; and
making pulses generated at the first DOWN output and the second DOWN output having the same pulse width.

23. The method of claim 22 further comprising:
providing a pulse at a third DOWN output when a pulse occurs at the first DOWN output or the second DOWN output.

24. The method of claim 22 further comprising: using pulses at the first and second DOWN outputs to adjust the second clock signal.

25. The method of claim 22 wherein one pulse is generated at either the first DOWN output or the second DOWN output at a time.

26. A method of maintaining a phase relationship between a first clock signal and a second clock signal comprising:
providing a first UP output, a second UP output, a first DOWN output, and a second DOWN output;
starting in an initial state;
transitioning to a first UP state and generating a pulse at the first UP output when a first edge of the first clock signal leads a first edge of the second clock signal;
transitioning to a second UP state and generating a pulse at the second UP output when a second edge of the first clock signal leads the first edge of the second clock signal;
transitioning to a first DOWN state and generating a pulse at the first DOWN output when a third edge of the first clock signal lags a third edge of the second clock signal; and
transitioning to a second DOWN state and generating a pulse at the second DOWN output when a fourth edge of the first clock signal lags the third edge of the second clock signal,
wherein one pulse is generated at either the first UP output or the second UP output at a time.

27. The method of claim 26 comprising:
providing a pulse at a third UP output when a pulse occurs at the first UP output or the second UP output.

28. The method of claim 26 comprising:
using pulses at the first and second UP outputs to adjust the second clock signal.

29. The method of claim 26 further comprising:
making pulses generated at the first UP output and the second UP output having the same pulse width.

30. The method of claim 26 further comprising:
providing a pulse at a third DOWN output when a pulse occurs at the first DOWN output or the second DOWN output.

31. The method of claim 26 further comprising:
using pulses at the first and second DOWN outputs to adjust the second clock signal.

32. The method of claim 26 wherein one pulse is generated at either the first DOWN output or the second DOWN output at a time.

33. The method of claim 26 further comprising:
making pulses generated at the first DOWN output and the second DOWN output having the same pulse width.

* * * * *